United States Patent [19]
Cantone et al.

[11] Patent Number: 5,760,628
[45] Date of Patent: Jun. 2, 1998

[54] CIRCUIT AND METHOD FOR GENERATING PULSES IN RESPONSE TO THE EDGES OF AN INPUT SIGNAL

[75] Inventors: Giuseppe Cantone, Siracusa; Aldo Novelli, Ml., both of Italy

[73] Assignees: SGS-Thomson Microelectronics S.r.l., Agrate Brianza; Consorzio Per la Ricerca sulla Microelettronica nel Mezzogiorno (Co.Ri.M.Me), Catania, both of Italy

[21] Appl. No.: 657,824

[22] Filed: May 31, 1996

[30] Foreign Application Priority Data

May 31, 1995 [EP] European Pat. Off. ............. 95830227

[51] Int. Cl.$^6$ ........................................... H03H 11/26
[52] U.S. Cl. .................... 327/263; 327/264; 327/285; 327/20; 327/218; 327/225
[58] Field of Search .................... 327/164, 170, 327/171, 261, 291, 263, 264, 210, 29, 30, 28, 18, 20, 165, 200, 217, 218, 225, 285

[56] References Cited

U.S. PATENT DOCUMENTS

| | | | |
|---|---|---|---|
| 4,484,142 | 11/1984 | Rub et al. | 328/155 |
| 5,059,818 | 10/1991 | Witt et al. | 307/269 |
| 5,233,232 | 8/1993 | Steubing et al. | 307/234 |

FOREIGN PATENT DOCUMENTS

| | | | |
|---|---|---|---|
| 0 330 628-A | 8/1989 | European Pat. Off. | H03K 17/06 |
| 0 463 854 A | 1/1992 | European Pat. Off. | H03K 5/15 |
| 33 03904 C | 9/1984 | Germany | H03K 5/04 |
| 60-010913 | 1/1985 | Japan | H03K 5/00 |
| 60-100820 | 6/1985 | Japan | H03K 3/033 |
| 61-080914 | 4/1986 | Japan | H03K 17/687 |

*Primary Examiner*—Timothy P. Callahan
*Assistant Examiner*—Jung Ho Kim
*Attorney, Agent, or Firm*—David V. Carlson; Bryan A. Santarelli; Seed and Berry LLP

[57] ABSTRACT

A pulse generator has an input and two outputs at which to respectively generate pulses in relation to different types of signal edges received at the input of the generator. The generator provides two distinct logic circuit blocks of the sequential type, the blocks being mutually independent for generation of the pulses at the two outputs. In this manner it is possible to easily control the characteristics of the pulses. In addition, if two blocks are connected with appropriate and simple logic networks, it is possible in the generation phase to impose conditions between the pulses at the two outputs in a simple manner and with a certain freedom.

11 Claims, 4 Drawing Sheets

CIRCUIT AND METHOD FOR GENERATING PULSES IN RESPONSE TO THE EDGES OF AN INPUT SIGNAL

TECHNICAL FIELD

The present invention relates generally to electronic devices, and more specifically to a pulse generator that receives an input signal and generates on a first output a first pulse in response to a first edge of the input signal and generates on a second output terminal a second pulse in response to a second edge of the input signal.

BACKGROUND OF THE INVENTION

For electronic devices and, in particular, if they are the type designed to operate at high voltages, much care should be dedicated to the study of their drive circuits, since these circuits see on one side very low voltages, e.g., 5V coming from a logic circuit, and on the other side very high voltages, e.g., 500V.

This problem becomes still more important when the logic circuit, the drive circuit, and the high-voltage electronic device are integrated in the same chip.

A conventional architecture is shown in FIG. 1. The drive circuit has a control input IN and a drive output OUT, and comprises a pulse generator GEN having an input ID connected to the input IN and a first output OR and a second output OS at which GEN generates respectively a pulse in relation to an edge of a different type at the input ID. The drive circuit also comprises a first transistor MR and a second transistor MS both of the n-channel MOS type and having control terminals respectively connected to the output OR and the output OS and source terminals connected to ground GND. The drive circuit also comprises a level shifter network LS having two inputs respectively connected to the drain terminals of the transistors MR and MS, and having two corresponding outputs. The drive circuit also comprises a flip-flop FFD sensitive to the pulses at its inputs and having a reset input IR connected to the output of the network LS corresponding to the transistor MR and a set input IS connected to the output of the network LS corresponding to the transistor MS and a state output OQ connected to the output OUT. Often between the output OQ and the output OUT is placed an output amplifier or buffer, which is omitted for clarity in FIG. 1. The output OUT is coupled to the control terminal of a controlled electronic device. In one embodiment, the controlled device is a high-voltage device that may be integrated on the same integrated circuit as the drive circuit. In another embodiment, the controlled device includes an electronic device that is coupled to one or more of the windings of an electric motor and that is operable to provide power to the windings, and thus to the motor. In yet another embodiment, the control device is a switching power supply that has a regulating element coupled to the output OUT. It is noted that in FIG. 1 are shown the intrinsic diodes DR and DS of transistors MR and MS, respectively. The network LS is often merely made up of a pair of equal resistors of appropriate value connected between the drain terminals of the MOS transistors and a reference voltage and the inputs IR and IS are connected respectively and directly to the drain terminals of the transistors MR and MS.

A possible, simple and widespread electrical diagram for the generator GEN is shown in FIG. 2. GEN comprises a resistor RES having a first terminal connected to the input ID, a capacitor CAP having a first terminal connected to ground GND and a second terminal connected to a second terminal of the resistor RES, and an inverter INV having its input connected to the second terminals of the resistor RES and of the capacitor CAP. A logic gate G2 of the NAND type has a first input connected to the output of the inverter INV, a second input connected to the input ID, and an output connected to the output OS. A logic gate G1 of the OR type has a first input connected to the input ID, a second input connected to the output of the inverter INV, and an output connected to the output OR.

GEN is level sensitive and has a single element corresponding to the assembly of the resistor RES and the capacitor CAP to generate a delay corresponding to the duration of an output pulse. It ensues that with increase of signal frequency at the input ID and/or the appearance of spurious pulses of extended duration at the input ID the pulses at the outputs OR and OS no longer have characteristics, in particular concerning the duration and mutual position in time, such as to correctly drive the downstream circuits. In the worst cases there may occur a failure to recognize commands at the input ID with very serious consequences in the case of commands for turning-off the driven electronic device.

SUMMARY OF THE INVENTION

The purpose of the present invention is to overcome the shortcomings of the prior art.

In accordance with one aspect of the present invention a pulse generator is provided having an input terminal and first and second output terminals. A first bistable circuit has a clock input coupled to the input terminal, an output coupled to the first output terminal, and a reset input. A first delay circuit is coupled between the output and reset input of the first bistable circuit. A second bistable circuit has a clock input coupled to the input terminal, an output coupled to the second output terminal, and a reset input. A second delay circuit is coupled between the output and reset input of the second bistable circuit.

In accordance with a related aspect of the present invention, an enable circuit is interposed between the input terminal and the first and second bistable circuits. The enable circuit has a first input that is coupled to the output of the first bistable circuit, a second input coupled to the input terminal, and an output coupled to the clock inputs of both the first and second bistable circuits.

In another related aspect of the invention, an enable circuit is interposed between the second delay circuit and the reset input of the second bistable circuit. The enable circuit has a first input that is coupled to the output of the first bistable circuit, a second input that is coupled to the second delay circuit, and an output that is coupled to the reset input of the second bistable circuit.

The present invention also relates to an integrated circuit including an electric motor control system and a switching feeder in which the drive circuit in accordance with the present invention finds advantageous application.

If for generation of the pulses at the two outputs OR and OS there are used two distinct sequential logic circuit blocks, hence mutually independent, it is possible to control easily the characteristics of the pulses.

Furthermore if the two blocks are connected by appropriate and simple logical networks it is possible to impose in the generation phase conditions between the pulses at the two outputs in a simple manner and with a certain freedom.

BRIEF DESCRIPTION OF THE DRAWINGS

The invention is clarified by the following description considered together with the annexed drawings wherein.

DETAILED DESCRIPTION OF THE INVENTION

Figure 3:
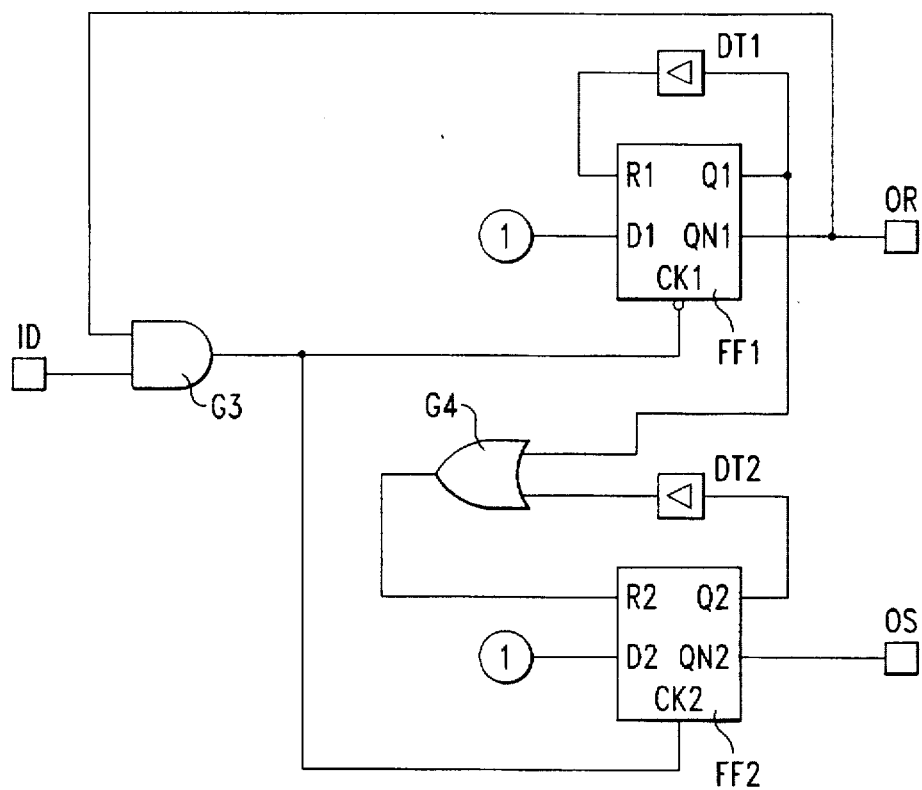
FIG. 3 shows a circuit diagram of a possible implementation of the pulse generator in accordance with the present invention.

The generator of FIG. 3 has an input ID designed to receive digital signals and a first output OR and a second output OS at which to respectively generate pulses in relation to edges in the digital signal at the input ID. For example, in FIG. 3, the outputs OR and OS are normally at a high logic state, and a negative pulse is generated at the output OR if the signal at the input ID goes from the high logic state to the low logic state, and a negative pulse is generated at the output OS if the signal at the input ID goes from low logic state to high logic state. This behavior is illustrated in the time chart of FIG. 4, which represents the simultaneous behavior in time of the signals at the input ID and the outputs OS and OR.

The generator of FIG. 3 consists of two distinct sequential logic circuit blocks each having its own input and output. The inputs are both connected to the input ID through an AND logic gate G3, whose function is explained below, and the outputs are connected respectively to the outputs OR and OS.

Because the two blocks are independent of each other, it is easy to control the characteristics of the generated pulses.

The two blocks are essentially equal. The first block comprises a first, type D, flip-flop FF1 that is sensitive to the edges of the input signals. FF1 has a data input D1 that receives a predetermined logic value, high or "1" in the example, a clock input CK1 connected to the block input, an asynchronous reset input R1 which is active "high" in the example, a first state output Q1 in normal form, and a second state output QN1 in negated form connected to the output of the block, a first asymmetrical delay network DT1, for two types of edge, that has an input connected to the first output Q1 and an output connected to the reset input R1. Similarly the second block comprises a second, type D, flip-flop FF2 that is sensitive to the edges of the input signals and that has a data input D2 that receives a predetermined logic value, 'high' or '1' in the example, a clock input CK2 connected to the block input, an asynchronous reset input R2, which is active 'high' in the example, a first state output Q2 in normal form, a second state output QN2 in negated form connected to the block output, a second asymmetrical delay network DT2, for two types of edge, that has an input connected to the first output Q2 and an output coupled with the reset input R2.

The fact that the two flip-flops are the edge-sensitive type permits signals at the input ID to be frequency limited in a first approximation only by the characteristic delay of the networks DT1 and DT2.

As may be seen in FIG. 3, the flip-flop FF1 and the flip-flop FF2 are different since the former has a clock input CK1 sensitive to falling edges, and the latter has an input CK2 sensitive to rising edges. In addition, in the second block, the output of the network DT2 is connected to the input R2 through a logic gate G4 of the OR type whose function is explained below. Alternatively, two identical blocks can be employed and an inverter connected between the output of G3 and the terminal CK1 of the flip-flop FF1.

In the example of FIG. 3 the delay networks DT1 and DT2 are each such that a rising edge at its input is brought back at its output with a predetermined delay, while a falling edge at its input is brought back at its output practically instantaneously, except for delays in propagation of the signals in the network. This is important so that the generator will be ready to process a new edge at the input as soon as a pulse is generated at the output.

If the two blocks are connected by appropriate and simple logical networks, it is possible in the generation to impose phase conditions between the pulses at the two outputs OR and OS simply and with a certain freedom.

For many electronic device drive circuits, a first requirement is that no more pulses be generated at the output OR if there is already a pulse at the output OR. This is achieved by means of a first logic network G3 connected at a first input to the input ID and at a second input to the output OR, and connected at its output to both the inputs of the two blocks. In the example of FIG. 3, the network G3 consists merely of an AND logical gate preventing arrival of edges at the inputs of the two blocks if the output OR is at the low logic state.

For many of the drive circuits, there is a second requirement that there be no pulse at the output OS if a pulse is generated at the output OR. This is achieved by means of a second logical network G4 connected at its inputs to the output Q1 and to the output of the network DT2, respectively, and connected at output to the input R2. In the example of FIG. 3, the network G4 consists merely of an OR-type logical gate which keeps the flip-flop FF2 reset if the output OR is in the low logic state.

Figure 5A:
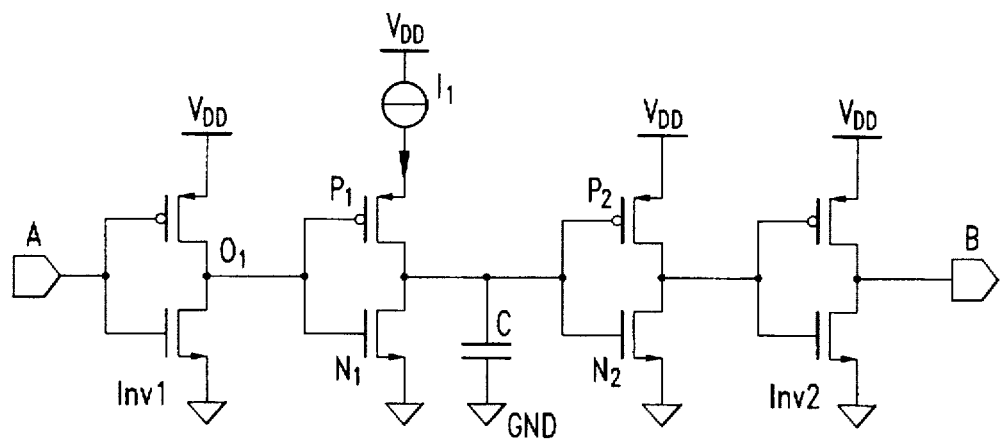
FIGS. 5A–B show circuit diagrams of delay networks that may be in the generator of FIG. 3.

A possible embodiment of the delay networks DT1 and DT2 is shown in FIG. 5A. The delay network exhibits an input A and an output B, and comprises a capacitor C having a first terminal coupled indirectly to the output B and a second terminal connected to ground GND. A conventional CMOS inverter $Inv_1$ has an input coupled to input A, and an output $O_1$. A p-channel MOS transistor P1 has its control terminal connected to the output $O_1$ and its drain terminal connected to a first terminal of the capacitor C. An n-channel MOS transistor N1 has its control terminal connected to the output $O_1$, its source terminal connected to ground GND, and its drain terminal connected to the first terminal of the capacitor C. A current generator I1 has its input connected to a potential reference, in this example to the power supply VDD, and its output connected to the source terminal of the transistor P1. In this manner, when the input A is in a high logic state, the capacitor C is charged with constant current by the generator I1 through the active transistor P1, and when the input A is in a low logic state, the capacitor C is discharged to ground GND by the active transistor N1. While the charge phase lasts a finite time determined by the ratio of the current of the generator I1 to the capacitance of the capacitor C, the discharge phase is almost instantaneous.

Still referring to FIG. 5A, the first terminal of the capacitor C is connected to the output terminal B through a conventional CMOS inverter $Inv_2$, which is serially coupled to a second conventional CMOS inverter fulfilling the functions of bufferization and logical inversion. The second CMOS inverter includes another p-channel MOS transistor P2 and another n-channel MOS transistor N2 connected between the power supply VDD and ground GND in a conventional manner.

Figure 5B:
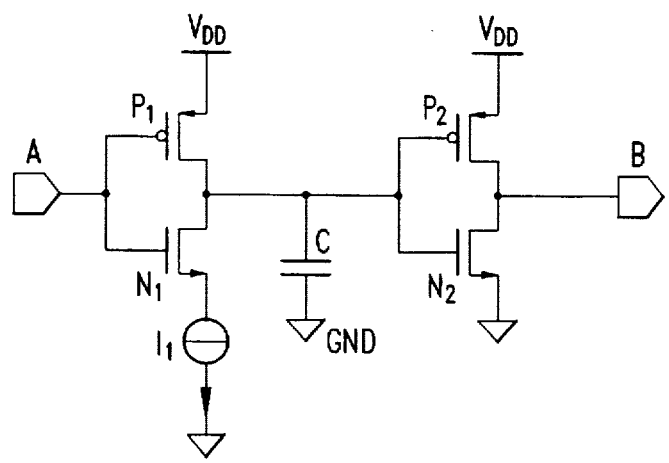

FIG. 5B is a circuit diagram of another possible embodiment of the delay networks DT1 and DT2 of FIG. 3. The circuit of FIG. 5B is similar to that of FIG. 5A except that the circuit of FIG. 5B lacks the conventional inverters $Inv_1$ and $Inv_2$, and that the current generator I1 is coupled between the source of the transistor N1 and ground. Thus, when the signal at the input A transitions to a high logic level, the transistor N1 turns on and allows the current source I1 to discharge the capacitor C with a constant current. When the capacitor C discharges to a predetermined threshold voltage level, the p-channel transistor P2 turns on and the n-channel transistor N2 turns off. Thus, the transistor P2 transitions the signal at the output B from a low logic level to a high logic level, and the rising edge of the signal at the input A is delayed a predetermined time before it propagates through to the output B. When the signal at the input A transitions from a logic high to a logic low, the capacitor C is charged directly from the power supply voltage VDD via the active transistor P1. When the capacitor C charges to a predetermined threshold voltage, the transistor P2 turns off and the transistor N2 turns on, and thus transitions the signal at the terminal B from a logic high to a logic low. Because the current that charges the capacitor C is not limited by a current generator or by other means, the capacitor C charges relatively quickly and thus the falling edge of the signal at the input A is delayed very little as compared with the delay of the rising edge. The characteristic delay of the networks DT1 and DT2 in case of particular requirements can be made different to achieve a turn-on pulse for the electronic device of a duration different from that of the turn-off pulse.

In dimensioning the delay networks it is necessary to allow for the dynamics of the electronic device to be driven, the minimum duration of the pulses for correct switching of the successive stages, and the type and duration of the spurious pulses at the input.

Figure 1:
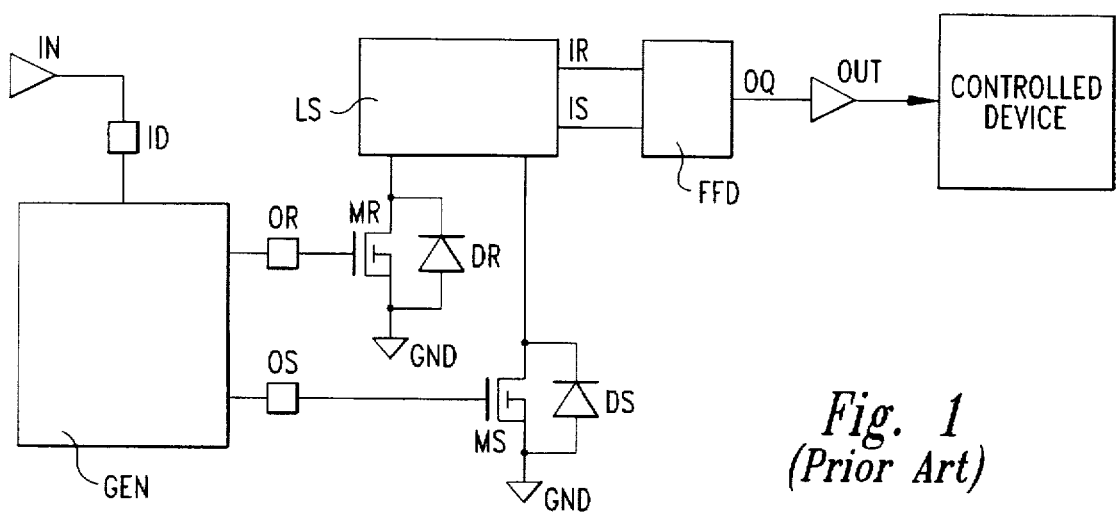
FIG. 1 shows a block diagram of a drive circuit in accordance with the prior art.
Figure 2:
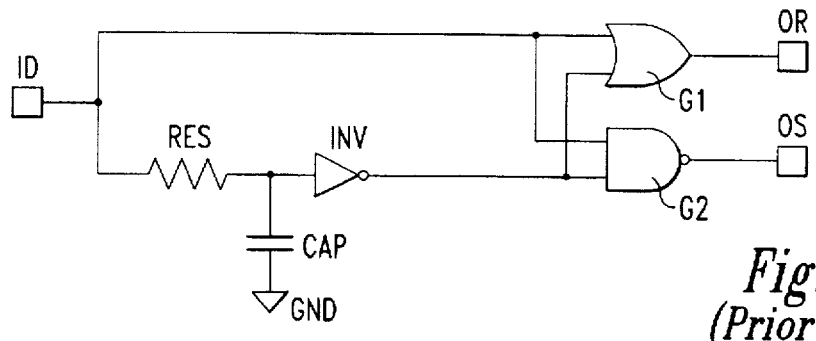
FIG. 2 shows a circuit diagram of a pulse generator in accordance with the prior art.

A generator in accordance with the present invention, e.g., the one just described, could be inserted advantageously in a drive circuit for electronic devices like that of the prior art shown in FIG. 1 with the advantages set forth above.

In comparison with the circuit of the prior art of FIG. 1 the driving of the transistors MR and MS takes place differently as follows. The drive pulses are never overlapped in time and are of fixed and predetermined duration, the pulses to the transistor MR cannot be interrupted in any case and they are thus all strictly of the predetermined duration, and the pulses to the transistor MS are interruptible if there is a requirement to send a pulse to the transistor MR. Even if the flip-flop FFD were the JK type, the presence of two pulses simultaneously at the outputs OR and OS would give no advantage but rather instability in operation.

Figure 4:
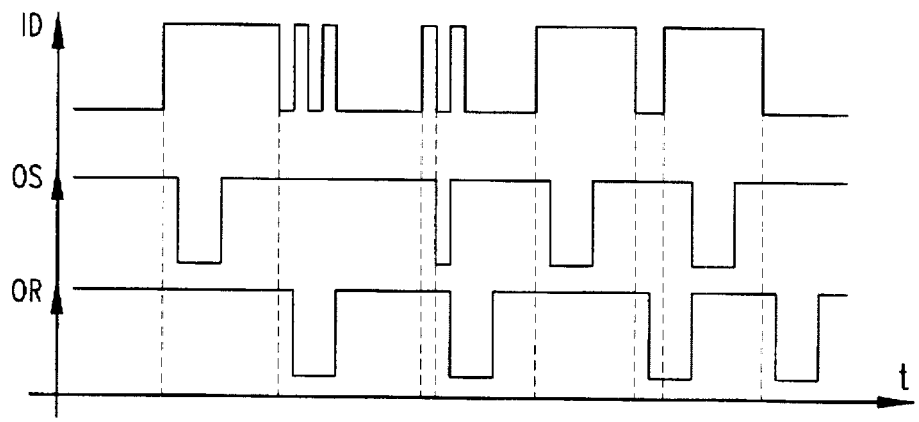
FIG. 4 shows a time chart of the input and output signals of the generator of FIG. 3.

In FIG. 4 can be seen how spurious pulses following a falling edge on the input ID have no effect on the outputs OR and OS. It may also be seen that the isolated spurious pulses have the effect of taking the electronic device to the off state in a manner not causing damage. Lastly it may be seen that two rapidly succeeding edges are correctly read by the generator and give rise to a pulse at the output OR and a pulse at the output OS.

It might be advantageous to drive the transistors MR and MS in current instead of voltage as illustrated in FIG. 1 in order to limit the dissipation of power to the level shifter.

Indeed, a voltage pulse acting on the control terminal of the transistor MR or MS would give rise in case of voltage drive to a high current peak which, in addition to increasing the dissipation, would involve a higher discharge of the bootstrap capacitance normally used in this type of control system.

Figure 6:
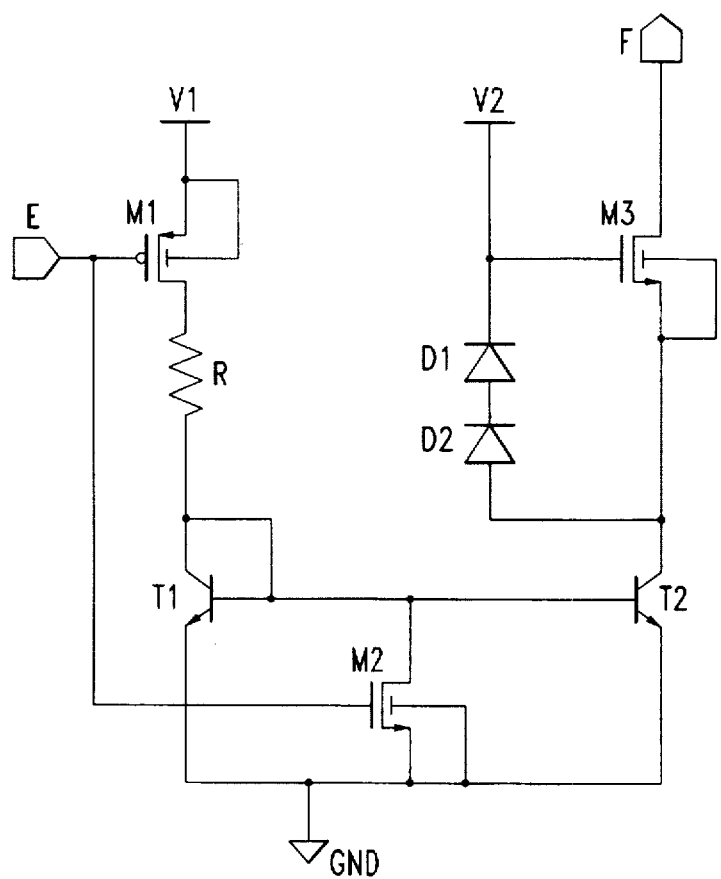
FIG. 6 shows a circuit diagram of a drive stage usable in a drive circuit in accordance with the present invention.

For this purpose, downstream of the outputs OR and OS can be connected a drive stage like the one illustrated in FIG. 6. It exhibits an input E which can be connected to the output OR or OS and an output F which can be coupled to the input IR or IS of the flip-flop FFD. It is noted that the n-channel MOS transistor M3 corresponds functionally to the transistor MR or MS of FIG. 1.

The stage of FIG. 6 comprises conceptually a current generator and a current mirror. The input E permits activation or deactivation of the stage in the example of FIG. 6 through two MOS transistors.

In greater detail, the stage comprises a p-channel MOS transistor M1 having its control terminal connected to the input E and its source terminal connected to a potential reference V1, and a resistor R having a first terminal connected to the drain terminal of the transistor M1 and a second terminal connected to an input terminal of the current mirror. An output terminal of the mirror is connected to the source terminal of the transistor M3. The control terminal of the transistor M3 is connected to a potential reference V2.

The reference values V1 and V2 must be chosen appropriately in relation to the rest of the drive circuit. In particular, as a digital signal is supplied to the input E, the value of V1 must be chosen such that when the input signal has high potential the transistor M1 is off while when the input signal has low potential the transistor M1 is turned-on.

The current mirror is implemented in a simple manner, e.g., as in FIG. 6 by means of an npn junction transistor T1 having its collector terminal connected to the mirror input, its emitter terminal connected to ground GND and its base terminal connected to the collector terminal. An npn junction transistor T2 has its emitter terminal connected to ground GND, its base terminal connected to the base terminal of the transistor T1, and its collector terminal connected to the current mirror output.

Lastly, the stage of FIG. 6 comprises a protection network comprising two diodes D1 and D2 connected in series between the collector of the transistor T2 and the reference V2. The function of the diodes is to protect the transistor T2 during the turn-off transients. Indeed, when the transistor T2 is off, the potential of its collector could reach very high values and the voltage VCE could exceed the breakdown threshold. The presence of the two diodes limits the collector potential to slightly higher than V2.

To ensure that the transistor T2 is off and thus does not supply current to the output of the mirror when the transistor M1 is off, it is appropriate to insert an n-channel MOS transistor M2 between the base terminal of the transistor T2 and ground GND and connect the control terminal to the input E. In this manner when the input signal has low potential, the transistor M1 is energized and the transistor M2 is off and thus it is as though it were not there, neither for the transistor T2 nor consequently for the mirror. When the input signal has a high potential the transistor M1 is off and the transistor M2 is turned-on and thus short-circuits the base and emitter of the transistor T2, which is kept off.

The drive circuit discussed above can be advantageously integrated in a chip through the use of manufacturing processes which ensure adequate insulation. One could also insert in the chip at least one high-voltage electronic device having its control terminal coupled to the output of the drive circuit. In this manner can be achieved a new high-voltage electronic device which can be driven without problems by a low-voltage logic signal. One could also insert in the chip additional logic circuitry which would in turn drive the drive circuit.

Typical advantageous applications of the present invention are control systems for electric motors and switching voltage regulators. The ability to operate on very high-frequency input signals up to 500 kHz and change the duty cycle between limit values permits achieving high efficiency in both applications.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A pulse generator, comprising:
   an input terminal;
   first and second output terminals;
   a first bistable circuit having a clock input coupled to said input terminal, an output coupled to said first output terminal, and a reset input;
   a first delay circuit coupled between said output and said reset input of said first bistable circuit;
   a second bistable circuit having a clock input coupled to said input terminal, an output coupled to said second output terminal, and a reset input;
   a second delay circuit coupled between said output and said reset input of said second bistable circuit; and
   an enable circuit that is interposed between said input terminal and said first and second bistable circuits, said enable circuit having a first input coupled to said output of said first bistable circuit, a second input coupled to said input terminal, and an output coupled to said clock inputs of said first and second bistable circuits.

2. A pulse generator, comprising:
   an input terminal;
   first and second output terminals;
   a first bistable circuit having a clock input coupled to said input terminal, an output coupled to said first output terminal, and a reset input;
   a first delay circuit coupled between said output and said reset input of said first bistable circuit;
   a second bistable circuit having a clock input coupled to said input terminal, an output coupled to said second output terminal, and a reset input;
   a second delay circuit coupled between said output and said reset input of said second bistable circuit; and
   an enable circuit that is interposed between said second delay circuit and said reset input of said second bistable circuit, said enable circuit having a first input coupled to said output of said first bistable circuit, a second input coupled to said second delay circuit, and an output coupled to said reset input of said second bistable circuit.

3. A pulse generator, comprising:
   an input terminal;
   first and second output terminals;
   a first D-type flip-flop having a clock input coupled to said input terminal, a first output coupled to said first output terminal, a second output, a signal input coupled to receive a first reference signal, and an asynchronous reset input;
   a first delay circuit coupled between said second output and said reset input of said first flip-flop;
   a second D-type flip-flop having a clock input coupled to said input terminal, a first output coupled to said second output terminal, a second output, a signal input coupled to receive a second reference signal, and an asynchronous reset input; and
   a second delay circuit coupled between said second output and said reset input of said second flip-flop.

4. The pulse generator of claim 3, further comprising a logic gate that is interposed between said input terminal and said first and second flip-flops, said logic gate having a first input coupled to said first output of said first flip-flop, a second input coupled to said input terminal, and an output coupled to said clock inputs of said first and second flip-flops.

5. The pulse generator of claim 3, further comprising a logic gate that is interposed between said second delay circuit and said reset input of said second flip-flop, said logic gate having a first input coupled to said second output of said first flip-flop, a second input coupled to said second delay circuit, and an output coupled to said reset input of said second flip-flop.

6. A pulse generator, comprising:
   a generator input coupled to receive a digital signal having a rising edge and a falling edge;
   first and second generator outputs;
   a first sequential logic circuit having a first input and having an output coupled to the first generator output, the first sequential logic circuit operable to generate a pulse on the first generator output in response to one of the signal edges;
   a second sequential logic circuit having first and second inputs and having an output coupled to the second generator output, the second sequential logic circuit operable to generate a pulse on the second generator output in response to the other signal edge;
   a first logical network having a first input coupled to the generator input, a second input coupled to the output of the first sequential logic circuit, and an output coupled to the first inputs of the first and second sequential logic circuits, the first logical network operable to prohibit the first and second sequential logic circuits from generating additional pulses when a pulse is present on the first generator output; and
   a second logical network having a first input coupled to the output of the first sequential logic circuit and having an output coupled to the second input of the second sequential logic circuit, the second logical network operable to reset the second sequential logic circuit when a pulse is present on the first generator output.

7. The pulse generator of claim 6 wherein the first input of the first sequential logic circuit is inverted with respect to the first input of the second sequential logic circuit.

8. The pulse generator of claim 6, further comprising:
   the first sequential logic circuit having a second input; and
   at least one of the first and second sequential logic circuits comprising,
   a D flip-flop having an edge-sensitive clock input coupled to the first input, a data input coupled to receive a predetermined logic value, an asynchronous reset input coupled to the second input, a first state output coupled to the first generator output, and a second state output, and
   an asymmetrical delay network that provides different delay times for rising and falling edges, the delay having an input coupled to one of the first and second state outputs and having an output coupled to the asynchronous reset input.

9. A pulse generator, comprising:

a generator input;

first and second generator outputs;

a first logic circuit having a first input coupled to the generator input, a second input, and an output;

a first bistable circuit having an edge-sensitive input coupled to the output of the first logic circuit and having a first output coupled to the first generator output and to the second input of the first logic circuit;

a second bistable circuit having an edge-sensitive input coupled the output of the first logic circuit, a first output coupled to the second generator output, and a reset input; and a second logic circuit having a first input coupled to the output of the first bistable circuit and having an output coupled to the reset input of the second bistable circuit.

10. The pulse generator of claim 9, further comprising:

the first bistable circuit having a reset input and a second output;

the second bistable circuit having a second output;

the second logic circuit having a second input;

a first delay circuit coupled between the second output and the reset input of the first bistable circuit; and a second delay circuit coupled between the second output of the second bistable circuit and the second input of the second logic circuit.

11. The pulse generator of claim 8 wherein the asymmetrical delay network comprises:

a. a capacitor coupled to the output of the delay network;

b. a first switch having a control terminal coupled to the delay network input and having a first conduction terminal coupled to the capacitor;

c. a second switch having a control terminal coupled to the delay network input and having a first conduction terminal coupled to the capacitor and a second conduction terminal coupled to a potential reference; and d. a current generator coupled to a second conduction terminal of the first switch so that the capacitor is charged & discharged by the current generator through the first switch and is discharged & charged from the potential reference through said second switch.

* * * * *